(12) United States Patent
Fu et al.

(10) Patent No.: US 10,243,099 B2
(45) Date of Patent: Mar. 26, 2019

(54) LIGHT-EMITTING DEVICE

(71) Applicants: EPISTAR CORPORATION, Hsinchu (TW); Asahi Kasei Corporation, Shizuoka (JP)

(72) Inventors: Jennhwa Fu, Hsinchu (TW); Hsin-Hsiung Huang, Hsinchu (TW); Mei-Li Wang, Hsinchu (TW)

(73) Assignees: Epistar Corporation, Hsinchu (TW); Asahi Kasei Corporation, Tokyo (JP)

( * ) Notice: Subject to any disclaimer, the term of this patent is extended or adjusted under 35 U.S.C. 154(b) by 0 days.

(21) Appl. No.: 15/596,729

(22) Filed: May 16, 2017

(65) Prior Publication Data

US 2018/0337304 A1 Nov. 22, 2018

(51) Int. Cl.
 *H01L 33/02* (2010.01)
 *H01L 33/00* (2010.01)
 *H01L 33/06* (2010.01)

(52) U.S. Cl.
 CPC ........ *H01L 33/025* (2013.01); *H01L 33/0025* (2013.01); *H01L 33/06* (2013.01)

(58) Field of Classification Search
 CPC ....... H01L 33/025; H01L 33/58; H01L 33/60; H01L 33/22; H01L 33/20; H01L 33/06; H01L 33/0025
 See application file for complete search history.

(56) References Cited

U.S. PATENT DOCUMENTS

| 7,977,695 | B2 | 7/2011 | Shim et al. | |
|---|---|---|---|---|
| 8,877,526 | B2 | 11/2014 | Ono et al. | |
| 9,012,942 | B2 | 4/2015 | Fu et al. | |
| 2011/0095327 | A1* | 4/2011 | Shinohara | H01L 33/16 257/98 |
| 2013/0313596 | A1* | 11/2013 | Fu | H01L 33/22 257/98 |
| 2017/0025573 | A1* | 1/2017 | Kim | H01L 33/22 |

FOREIGN PATENT DOCUMENTS

| CN | 103050598 A | 4/2013 |
|---|---|---|
| JP | 2012124257 A | 6/2012 |
| JP | 2012160502 A | 8/2012 |
| TW | I398023 B | 6/2013 |
| WO | 2013150984 A1 | 10/2013 |
| WO | 2016167281 A1 | 10/2016 |

* cited by examiner

*Primary Examiner* — Su C Kim
(74) *Attorney, Agent, or Firm* — Ditthavong & Steiner, P.C.

(57) ABSTRACT

A semiconductor device comprises a substrate comprising a surface area having a plurality of patterns therein, wherein the plurality of patterns comprises a plurality of first patterns and a plurality of second patterns; and a light-emitting stack formed on the substrate; wherein each of the first patterns comprises a first feature length and each of the second patterns comprises a second feature length smaller than the first feature length, and wherein, in a square area of 30 microns by 30 microns chosen from the surface area, an amount of the plurality of the first patterns is more than that of the plurality of the second patterns.

11 Claims, 5 Drawing Sheets

LIGHT-EMITTING DEVICE

TECHNICAL FIELD

This present application relates to a light-emitting device having a patterned substrate.

DESCRIPTION OF BACKGROUND ART

Light-emitting diode (LED) is a solid state semiconductor device and generally comprises a p-type semiconductor layer, an n-type semiconductor layer, and an active region formed between the p-type semiconductor layer and the n-type semiconductor layer for emitting light under the principle of transforming electrical energy to optical energy by injecting electrons and holes through the n-type semiconductor layer and the p-type semiconductor layer respectively to the active region to perform radiative combination and emit light.

SUMMARY OF THE DISCLOSURE

The present disclosure provides a semiconductor device comprises a substrate comprising a surface area having a plurality of patterns therein, wherein the plurality of patterns comprises a plurality of first patterns and a plurality of second patterns; and a light-emitting stack formed on the substrate; wherein each of the first patterns comprises a first feature length and each of the second patterns comprises a second feature length smaller than the first feature length, and wherein, in a square area of 30 microns by 30 microns chosen from the surface area, an amount of the plurality of the first patterns is more than that of the plurality of the second patterns.

DETAILED DESCRIPTION OF THE PRESENT DISCLOSURE

Figure 1:
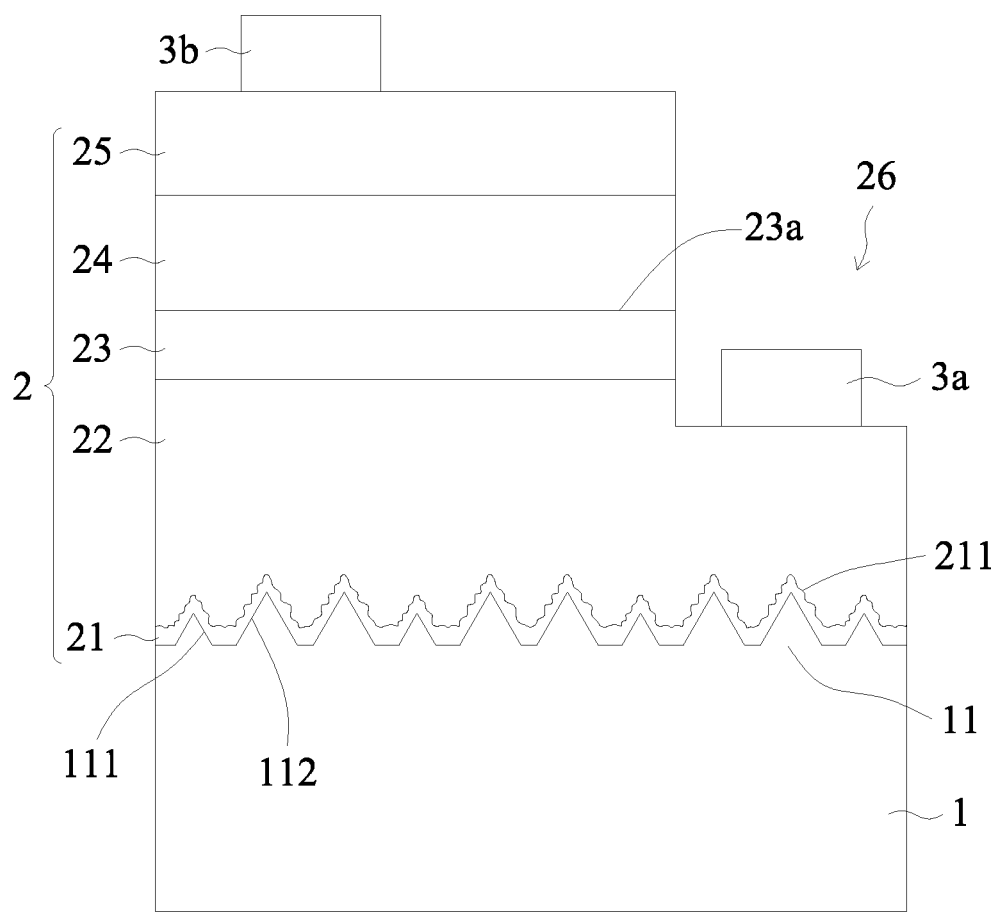
FIG. 1 shows a light-emitting device in accordance with one embodiment of the present disclosure.

The embodiment of the application is illustrated in detail, and is plotted in the drawings. The same or the similar parts are illustrated in the drawings and the specification with the same reference numeral.

FIG. 1 shows a light-emitting device 100 in accordance with the present disclosure. The light-emitting device 100 comprises a substrate 1 and a light-emitting stack 2 formed on the substrate 1. The substrate 1 comprises a surface area 11 having a plurality of patterns therein. The plurality of patterns comprises a plurality of first patterns 111 and a plurality of second patterns 112 protruded from a plane of the substrate.

The light-emitting stack 2 comprises a buffer layer 21 epitaxially grown on the substrate 1, a first semiconductor layer 22 with a first conductivity-type epitaxially grown on the buffer layer 21, an active region 23 epitaxially grown on the first semiconductor layer 22, a second semiconductor layer 24 with a second conductivity-type epitaxially grown on the active region 23 and a current spreading layer 25 deposited on the second semiconductor layer 24. The first conductivity-type of the first semiconductor layer 22 is different from the second conductivity-type of the second semiconductor layer 24. For example, the material of the first semiconductor layer 22 comprises n-type gallium nitride (GaN) and the second semiconductor layer 24 comprises p-type gallium nitride. The active region 23 comprises a structure selected from a group consisting of homostructure, single heterostructure (SH), double heterostructure (DH), and multiple quantum wells (MQW). The current spreading layer 25 facilitates the driving current evenly spreading therein before injecting to the active region 23. The buffer layer 21 is single-crystalline structure or poly-crystalline structure. More preferably, the buffer layer 21 comprises single-crystalline structure which can be detected by nano-beam X-ray diffraction. In one embodiment, the buffer layer 21 is a single-crystalline buffer layer directly grown on the substrate 1, and locates between the substrate 1 and the first semiconductor layer 22 to reduce the crystal defects arising from lattice-mismatch between the substrate 1 and the first semiconductor layer 22. In one embodiment, the buffer layer 21 comprises a rough surface 211 opposite to a surface facing to the substrate 1 to release the stress during epitaxially growing the light-emitting stack 2, for example, a roughness of the rough surface 211 is about 1~10 nm. The roughness of the rough surface 211 is much smaller than that of the surface area 11 of the substrate 1. The material of the buffer layer 21 comprises gallium nitride (GaN), aluminum nitride (AlN), or aluminum gallium nitride (AlGaN), and preferably, the buffer layer 21 comprises AlN. The buffer layer 21 is formed by epitaxial process or sputtering method. Alternatively, the buffer layer 21 can be replaced by a bonding layer, and therefore, the material of the bonding layer comprises transparent polymer or transparent oxide for bonding the first semiconductor layer 22 to the substrate 1. The first semiconductor layer 22, the active region 23 and the second semiconductor layer 24 are formed by a known epitaxy method, such as metallic-organic chemical vapor deposition (MOCVD) method, molecular beam epitaxy (MBE) method, or hydride vapor phase epitaxy (HVPE) method. The material of the current spreading layer 25 comprises transparent conductive material, such as transparent conductive oxide (TCO).

The light-emitting device 100 further comprises a first electrode 3a and a second electrode 3b for being bonding pads for flipped-bonding or wire-bonding to an external device and introduces current into the light-emitting stack 2 to light up the light-emitting device 100. The light-emitting stack 2 has a lower region 26 exposing a part of the first semiconductor layer 22. The first electrode 3a is formed on the lower region 26 and electrically connects to the first semiconductor layer 22. The second electrode 3b is formed on the current spreading layer 25 and electrically connects to the second semiconductor layer 24. In other embodiment, the first electrode 3a and the second electrode 3b locate on the opposite sides of light-emitting device 100 respectively, for example, the first electrode 3a locates above the current spreading layer 25 of the light-emitting stack 2, and the second electrodes 3b locates under a backside of the substrate 1, which is away from the light-emitting layer 2.

Figure 2:
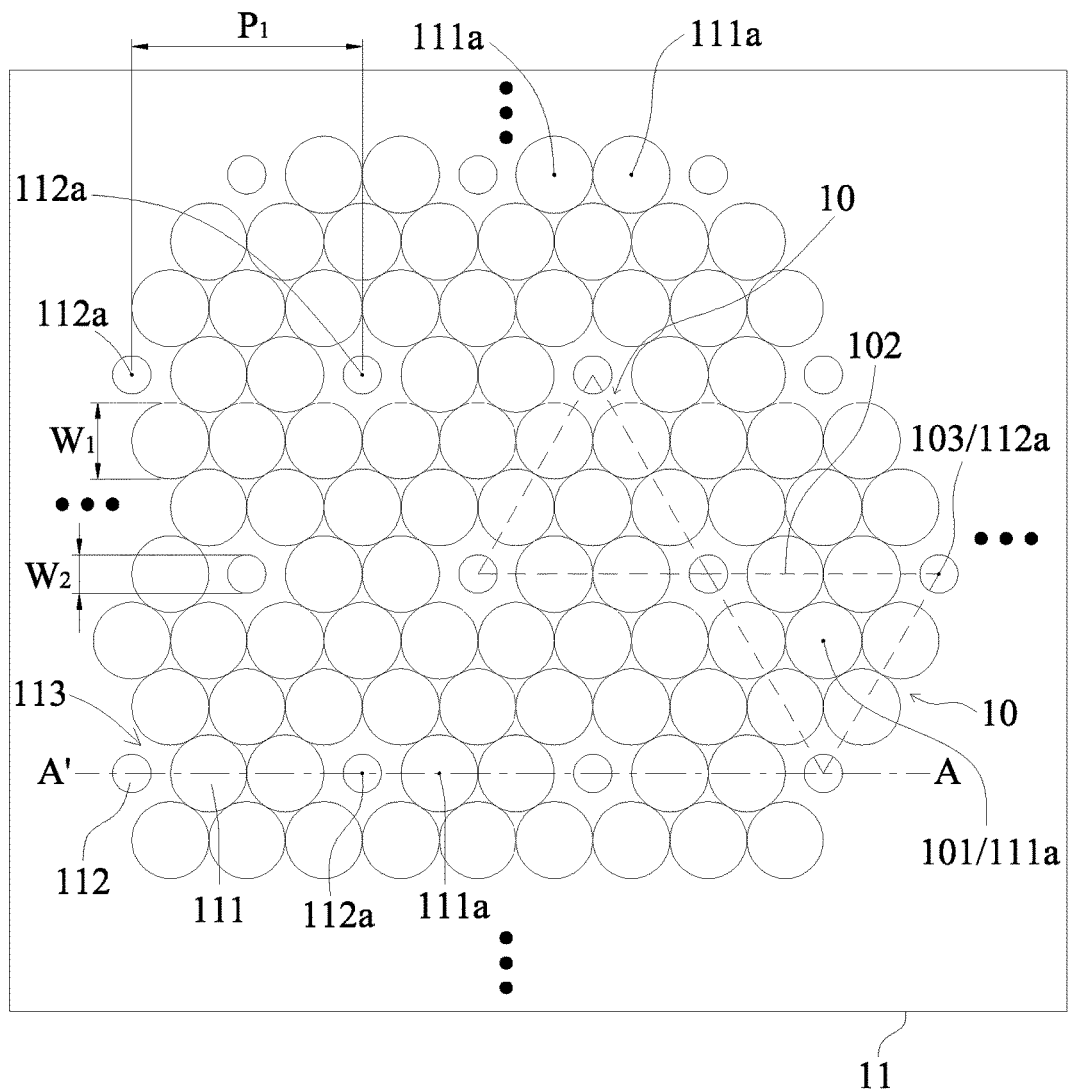
FIG. 2 shows a top view of the substrate of the light-emitting device in accordance with the first embodiment of the present disclosure.

FIG. 2 shows a top view of the substrate 1 of the light-emitting device 100 in accordance with the first embodiment of the present disclosure. The plurality of first patterns 111 and the plurality of second patterns 112 form in the surface area 11. The top-view shape of one of the first patterns 111 and/or the second patterns 112 comprises a regular polygon or a circle. Each of the first patterns 111 comprises a first feature length W1 and each of the second patterns 112 comprises a second feature length W2 smaller than the first feature length W1. In a square area of 30 microns by 30 microns chosen from the surface area 11, an amount of the plurality of the first patterns 111 is more than that of the plurality of the second patterns 112. The feature length in present disclosure refers to the longest distance between any two points on the periphery of a pattern structure, for example, the first pattern 111 or the second pattern 112 in the present embodiment. For example, the feature length of a circle refers to its diameter and the feature length of a rectangle refers to its diagonal. In the embodiment, the top-view shape of each first pattern 111 and each second pattern 112 comprises circle. The first feature length W1 is 1~3 µm, and the second feature length W2 is 0.5~1.7 µm. In one embodiment, the first feature length W1 is 1.1~5 times of the second feature length W2. It should be noted that a line A-A' shown in FIG. 2 substantially passes centers of every first patterns 111 and/or second patterns 112, such as the centers 111a of the first patterns 111 and the centers 112a of the second patterns 112, lining along the line A-A'.

Figure 3:
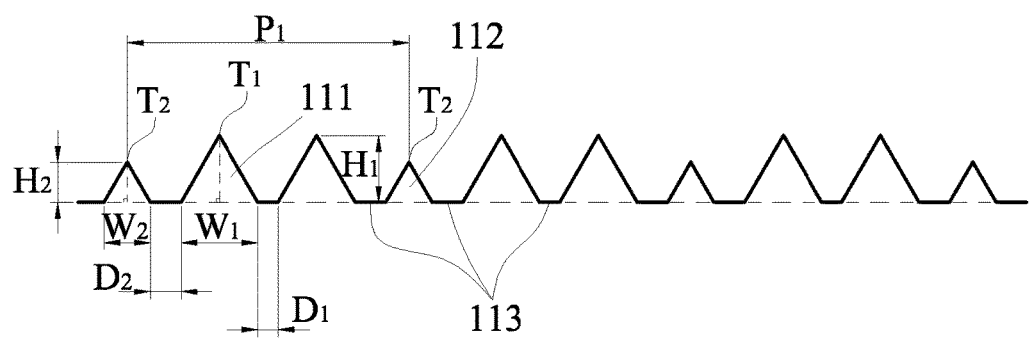
FIG. 3 shows a cross section view along line A-A' in FIG. 2.

FIG. 3 shows a cross-section view along the line A-A' in FIG. 2. As shown in FIG. 3, the cross-section shape of the first pattern 111 and/or the second pattern 112 comprises polygon, or hemi-circle, and preferably, triangle. In the embodiment, the cross-section shape of the first patterns 111 and/or the second patterns 112 is triangle or triangle-like. It should be noted that the first patterns 111, the second patterns 112, and the substrate 1 are monolithic and one-piece, and each of the first patterns 111 and the second patterns 112 are protruded from a non-patterned surface 113 of the substrate 1. The non-patterned surface 113 is devoid of any first patterns 111 and any second patterns 112 of the substrate 1 and surrounds the first patterns 111 and second patterns 112. Each of the first patterns 111 has a first height H1 from a top T1 of the first pattern 111 to a bottom of the first pattern 111, and each of the second patterns 112 has a second height H2 from a top T2 of the second pattern 112 to a bottom of the second pattern 112, and wherein the second height H2 is smaller than the first height H1. In one embodiment, the first height H1 is 0.3~2.2 and the second height H2 is 0.1~1.8 µm. In other embodiment, the first height H1 is 1.1~5 times of the second height H2. The top T1, T2 of one first pattern 111 or one second pattern 112 substantially coincides with the center 111a, 112a respectively thereof in the present embodiment.

Please refer to FIG. 1 to FIG. 3, the surface area 11 comprises the plurality of first patterns 111, the plurality of second patterns 112 and the non-patterned surface 113. The non-patterned surface 113 is substantially parallel to an upper surface 23a of the active region 23. In one embodiment, the substrate 1 comprises sapphire and the non-patterned surface 113 is sapphire c-plane. In FIG. 3, a same amount of the first patterns 111 is periodically arranged between adjacent two second patterns 112 along a first direction, e.g. along the line A-A'. In the present embodiment, two first patterns 111 periodically locate between adjacent two second patterns 112 along the first direction. In other words, there are two consecutive first patterns 111 between the adjacent two second patterns 112. It should be noted that the term "adjacent two second patterns 112" means no other second pattern 112 is interposed between the two second patterns 112 along the first direction, but does not exclude the situation that one or more first patterns 111 are interposed between the two second patterns 112. Furthermore, the term "two consecutive patterns" means no any pattern, no matter first pattern 111 or second pattern 112, is interposed between two patterns wherein the two patterns comprises two same-type patterns or two different-type patterns. A first space D1 between two consecutive first patterns 111 is not more than 0.8 µm for optimizing a fill factor (the definition of the fill factor will be described afterward) of the substrate 1. A second space D2 between the first pattern 111 and the consecutive second pattern 112 is 0.8~2 µm and greater than the first space D1. The light-emitting stack 2 is substantially grown from the non-patterned surface 113 and substantially no or less grown from the first pattern 111 and the second pattern 112. By having the second space D2 greater than the first space D1, the light-emitting stack 2 is majorly grown from the non-patterned surface 113 around each second pattern 112 and finally laterally coherent to the growing parts from adjacent second patterns 112 to totally cover the first patterns 111 and the second patterns 112. Specifically, the first semiconductor layer 22 substantially covers the first patterns 111 and the second patterns 112. The light-emitting device 100 formed by the present embodiment achieves higher fill factor of the substrate 1. In one embodiment, a space ratio of the second space D2 to the first space D1 is 1.01~2.5. FIG. 2 shows that the second patterns 112 are periodically arranged along line A-A' to have a first period P1 between the two centers 112a of adjacent two second patterns 112. The first period P1 is 1.5~8 µm. In one embodiment, for the plurality of patterns in the surface area 11, the distance between centers of two consecutive patterns is substantially the same.

The substrate 1 comprises a plurality of repeated units 10 by arranging the plurality of first patterns 111 periodically in the surface area 11 of the substrate 1 as well as arranging the plurality of second patterns 112 periodically in the surface area 11 of the substrate 1 as shown in FIG. 2. In one embodiment, each of the repeated unit 10 is composed of a first equivalent amount A1 of first patterns 111 and a second equivalent amount A2 of second patterns 112. The first equivalent amount A1 of first patterns 111 means the ratio of a sum of an effective surface area of the first patterns 111 in the repeated unit 10 to the surface area of one whole first pattern 111. Similarly, the second equivalent amount A2 of second patterns 112 means the ratio of a sum of an effective surface area of the second patterns 112 in the repeated unit 10 to the surface area of one whole second pattern 112. The surface areas of the first pattern 111 and the second pattern 112 herein indicate the areas defined by the top view of the substrate 1, such as shown in FIG. 2. In one repeated unit 10, a ratio of the first equivalent amount A1 of the first patterns 111 to a second equivalent amount A2 of the second patterns 112 is between 6 and 15, more preferably, the ratio is between 8 and 13 to achieve higher external quantum efficiency. A top-view shape of the repeated unit 10 comprises but not limited to be regular polygon, such as triangle, tetragon or hexagon. Specifically, in present embodiment and FIG. 2, the shape of each repeated unit 10 is triangle, and each repeated unit 10 comprises a center 101, edges 102 and vertices 103 where two edges 102 joins. In the embodiment, the repeated unit 10 comprises no other second patterns 112 except those located at the vertices 103 of the regular polygon. In other words, the second patterns 112 locate around all of the vertices of the regular polygon. Each of the vertex 103 locates at the center 112a of the respective second pattern 112. The repeated unit 10 comprises no other second patterns 112 except those located around the vertices 103 of the regular polygon in the present embodiment. In one repeated unit 10, one whole first pattern 111 fully in the repeated unit 10, six half of first patterns 111 located along the edges 102 of the repeated unit 10 and three one-sixth of second patterns 112 located around the vertices 103 of the repeated unit 10. Specifically, in the present embodiment, the top-view shape of the first patterns 111 and the second patterns 112 are circle. The first equivalent amount A1 of the first patterns 111 in the repeated unit 10 is determined to be A1=1+6×½=4, the second equivalent amount A2 of the second patterns 112 in the repeated unit 10 is determined to be A2=3×⅙=0.5, and the ratio of the first equivalent amount A1 to the second equivalent amount A2 is determined to be 8.

Moreover, a fill factor of the total area occupied by first patterns 111 and the second patterns 112 in the repeated unit 10 is 50~90%. In one embodiment, the fill factor in the repeated unit 10 is 60~85%. The fill factor is determined by the following equation (1):

Fill factor=[(a1+a2)/A]×100%   equation (1)

wherein a1 is a total area of the first patterns 111 in the repeated unit 10, a2 is a total area of the second patterns 112 in the repeated unit 10, and A is a total area of the repeated unit 10 from the top view as shown in FIG. 2. A higher fill factor, such as higher than 70%, could be fulfilled through the arrangement of the first pattern 111 and the second pattern 112 disclosed in the embodiment of the present invention.

Figure 4:
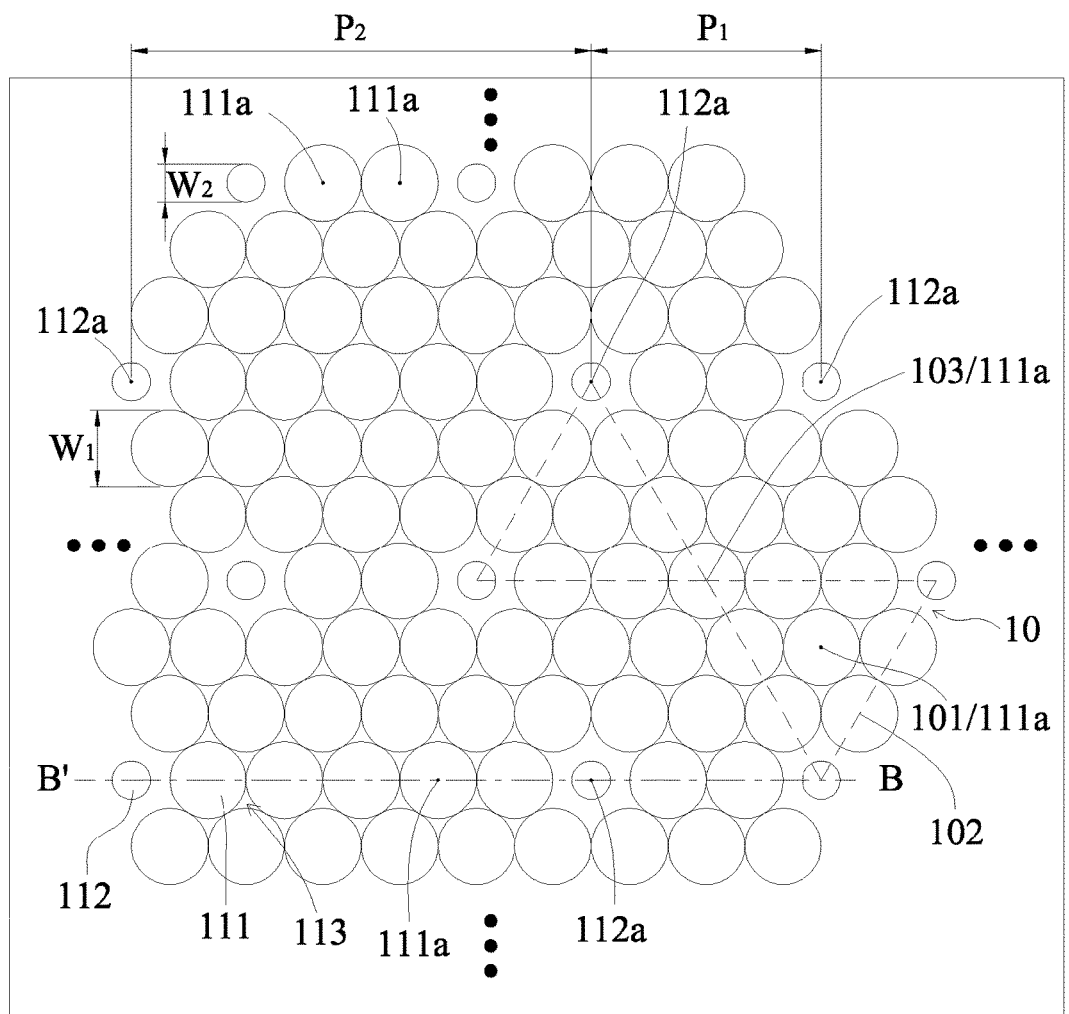
FIG. 4 shows a top view of the substrate of the light-emitting device in accordance with the second embodiment of the present disclosure.
Figure 5:
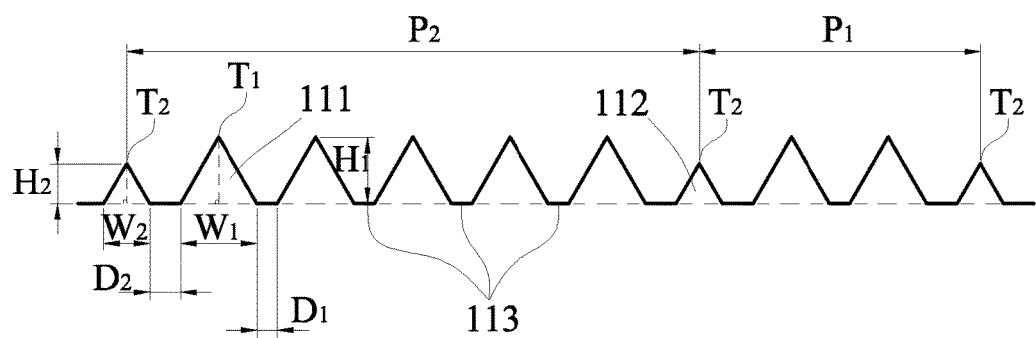
FIG. 5 shows a cross section view along line B-B' in FIG. 4.

FIG. 4 shows a top view of the substrate 1 of the light-emitting device 100 in accordance with the second embodiment of the present disclosure. The characters of the first patterns 111 and the second patterns 112, such as the first feature length W1, the second feature length W2, the first height H1 and the second height H2 in the present embodiment are the same as that in the first embodiment. The major difference between the present embodiment and the first embodiment is the arrangement of the first patterns 111 and the second patterns 112. The amount of the plurality of the first patterns 111 is more than that of the plurality of the second patterns 112 in a square area of 30 microns by 30 microns chosen from the surface area 11 of the substrate 1. FIG. 5 shows a cross-section view of a first direction of the substrate 1 in FIG. 4. Similar to the line A-A', line B-B' in FIG. 4 substantially passes centers of every first patterns 111 and second patterns 112 lining along a first direction. In order to optimize the fill factor of the substrate 1 of the light-emitting device 100, the first space D1 between the two consecutive first patterns 111 is not more than 0.8 μm and shorter than the second space D2 between the first pattern 111 and the consecutive second pattern 112 as shown in FIG. 5. For example, the second space D2 is 0.8~2 μm and larger than the first space D1 for optimizing the fill factor of the light-emitting device 100. The second patterns 112 is arranged along the line B-B' to have variable periods. Specifically, the second patterns 112 is arranged along the line B-B' to have a first period P1 and a second period P2 different from the first period P1, and the second patterns 112 are arranged by alternating the first period P1 and the second period P2 along the first direction. In one embodiment, the second period P2 is greater than the first period P1. The first period P1 between two adjacent second patterns 111 is 1.5~8 μm, and the second period P2 is 3~9 times of the first period P1, for example 4.5~15 μm. In one embodiment, two different amounts of the first patterns 111 are interposed between adjacent two second patterns 112 along the line B-B'. For example, a first group of five first patterns 111 and a second group of two first patterns 111 are alternately located between adjacent two second patterns 112 along the line B-B'. The numbers of the different amount of the first patterns 111 between the adjacent two second patterns 112, the first period P1 and the second period P2 could be verified according to the applications, and the embodiment shown above is not for the purpose to limit the scope of the disclosure.

In the present embodiment, the substrate 1 comprises a plurality of repeated units 10 shown in recurrence on the whole substrate 1, and therefore, the plurality of first patterns 111 and the plurality of the second patterns 112 are arranged periodically in the surface area 11 of the substrate 1. Similar to the first embodiment, the shape of each repeated unit 10 is triangle, and each repeated unit 10 comprises a center 101, edges 102 and vertices 103 where edges 102 joins. In one repeated unit 10, the one whole first pattern 111 fully in the repeated unit 10, six half of first patterns 111 located along the edges 102 of the repeated unit 10, a one-sixth first pattern 111 and two one-sixth second patterns 112 located around the vertices 103 of the repeated unit 10. Different from the first embodiment, one of the vertices 103 of the regular polygon locates at the center 111a of the respective first patterns 111 and the other two of the vertices 103 of the regular polygon locate at the center 112a of the respective second patterns 112 in the present embodiment. Therefore, the first equivalent amount A1 of the first patterns 111 in the repeated unit 10 is determined to be A1=1+6×½+1×⅙, which is about 4.167, the second equivalent amount A2 of the second patterns 112 in the repeated unit 10 is determined to be A2=2×⅙, and A2 is about 0.333, and the ratio of the first equivalent amount A1 to the second equivalent amount A2 in the present embodiment is about 12.5. The fill factor of the first pattern 111 and the second pattern 112 in the repeated unit 10 of the present embodiment is higher than that of the first embodiment, since the second pattern 112 in a vertex 103 of the repeated unit 10 is replaced by the first pattern 111 with larger surface area. For example, the fill factor of the first embodiment is 85.5% and the fill factor of the present embodiment is 87.22%.

Figure 6:
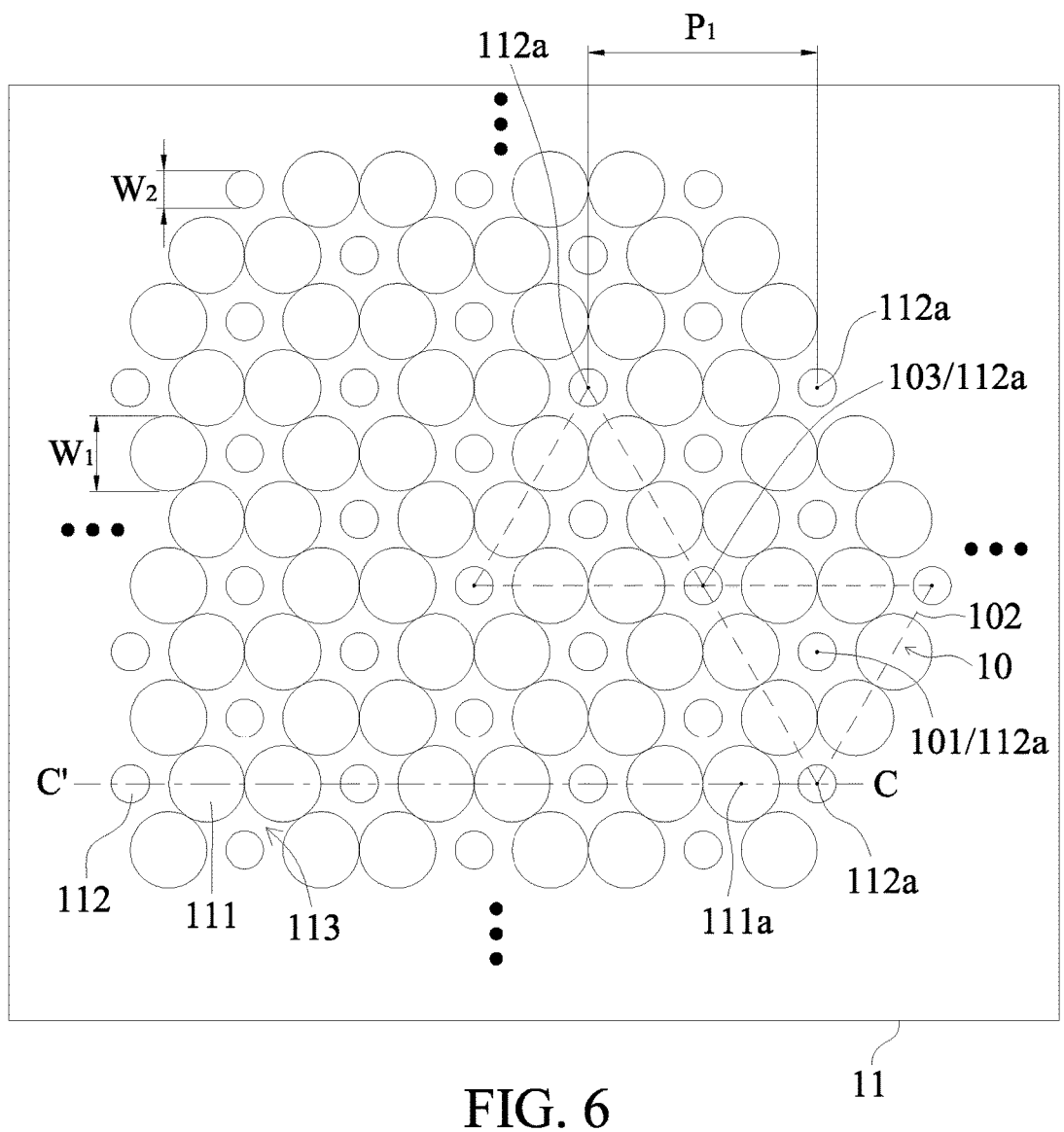
FIG. 6 shows a top view of the substrate of the light-emitting device in accordance with the third embodiment of the present disclosure.

FIG. 6 shows a top view of the substrate 1 of the light-emitting device 100 in accordance with a third embodiment of the present disclosure. The characters of the first patterns 111 and the second patterns 112, such as the first feature length W1 and the second feature length W2 in the present embodiment are the same as that in the first embodiment. The major difference between the present embodiment and the first embodiment is the arrangement of the first patterns 111 and the second patterns 112. An amount of the plurality of the first patterns 111 is more than that of the plurality of the second patterns 112 in a square area of 30 microns by 30 microns chosen from the surface area 11 of the substrate 1. Similar to the line A-A', line C-C' in FIG. 6 substantially passes centers of every first patterns 111 and second patterns 112 lining along a first direction. Different from the second embodiment, the second patterns 112 is arranged along the line C-C' to have constant period, which is the first period P1 in the present embodiment. In other words, the second patterns 112 are arranged with the first period P1 along the first direction. The first period P1 between two adjacent second patterns 111 is 1.5~8 μm. The substrate 1 comprises a plurality of repeated units 10 shown in recurrence on the whole substrate 1, and therefore, the plurality of first patterns 111 and the plurality of the second patterns 112 are arranged periodically in the surface area 11 of the substrate 1. Similar to the first embodiment, the shape of each repeated unit 10 is triangle, and each repeated unit 10 comprises a center 101, edges 102 and vertices 103 where two edges 102 joins. In one repeated unit 10, the one whole second pattern 112 fully in the repeated unit 10, six half of first patterns 111 located along the edges 102 of the repeated unit 10 and three one-sixth second pattern 112 located around the vertices 103 of the repeated unit 10. Different from the first embodiment, all of the vertices 103 of the regular polygon locate at the center 112a of the respective first patterns 111 in the present embodiment. Therefore, the first equivalent amount A1 of the first patterns 111 in the repeated unit 10 is determined to be $A1=6\times\frac{1}{2}=3$, and the second equivalent amount A2 of the second patterns 112 in the repeated unit 10 is determined to be $A2=1+3\times\frac{1}{6}=1.5$. In this way, the ratio of the first equivalent amount A1 to the second equivalent amount A2 in the present embodiment is about 2. The fill factor of the first pattern 111 and the second pattern 112 in the repeated unit 10 of present embodiment is lower than that of the first embodiment, since the first pattern 111 around the center 101 of the repeated unit 10 is replaced by the second pattern 112 with smaller surface area.

Figure 7:
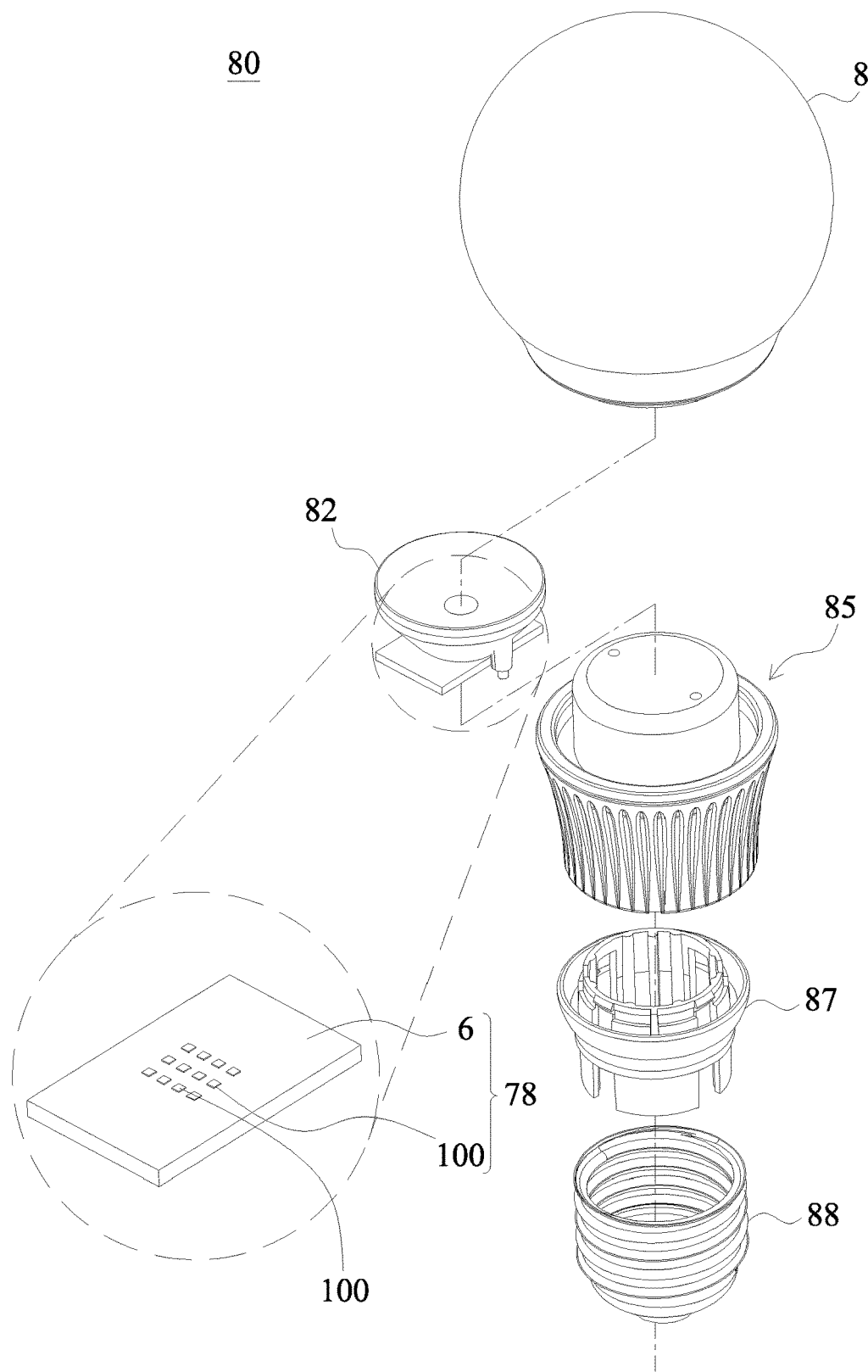
FIG. 7 shows a lighting apparatus comprising the light emitting device in accordance with one embodiment of the present disclosure.

The light-emitting device 100 described in the above embodiments could be further applied in various fields, such as lighting, backlight display, projector, flash, optical communication and so on. FIG. 7 shows a lighting apparatus comprising the light-emitting device 100 set forth in the foregoing embodiments. The lighting bulb 80 comprises a lighting module 78 which comprises a plurality of light-emitting devices 100 on a circuit board 6, an optical lens 82 covering the lighting module 78, a heat sink 85 having a mounting surface where the lighting module 78 formed thereon, a protective shell 81 covering the lighting module 78 and connected to the heat sink 85, a frame 87 connected to the heat sink 85, and an electrical connector 88 connected to the frame 87 and electrically connected to the lighting module 78. The light-emitting devices 100 can be connected in series or parallel by the circuit of the circuit board 6 depending on the driving voltage to be applied.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments mentioned above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A semiconductor device, comprising:
   a substrate comprising a surface area having a plurality of repeated units, one of which comprising a plurality of first patterns and a plurality of second patterns; and
   a light-emitting stack formed on the substrate,
   wherein each of the first patterns comprises a first feature length and each of the second patterns comprises a second feature length smaller than the first feature length, wherein, in a square area of 30 microns by 30 microns chosen from the surface area, an amount of the plurality of the first patterns is more than that of the plurality of the second patterns, and
   wherein the one of the plurality of the repeated unit satisfies the following equation:

$$50\% \leq [(a1+a2)/A] \times 100\% \leq 90\%$$

wherein, from a top view of the substrate, A is a total area of the one of the plurality of the repeated units, a1 is a total area of the first patterns in the one of the plurality of the repeated units, and a2 is a total area of the second patterns in the one of the plurality of the repeated units.

2. The semiconductor device of claim 1, wherein the first feature length is 1.1~5 times of the second feature length.

3. The semiconductor device of claim 1, wherein the one of the plurality of the repeated units is composed of a first equivalent amount of the first pattern and a second equivalent amount of the second pattern, and a ratio of the first equivalent amount of the first patterns to a second equivalent amount of the second patterns is between 6 and 15.

4. The semiconductor device of claim 3, wherein the ratio of the first equivalent amount of the first patterns to the second equivalent amount of the second pattern is between 8 and 13.

5. The semiconductor device of claim 1, wherein a top-view shape of one of the first patterns and/or the second patterns comprises a regular polygon or a circle.

6. The semiconductor device of claim 1, wherein the light-emitting stack further comprises a buffer layer directly grown on the substrate.

7. The semiconductor device of claim 1, wherein a top-view shape of the one of the plurality of the repeated units comprises a regular polygon.

8. The semiconductor device of claim 7, wherein the one of the plurality of the repeated units comprises no other second patterns except those located around vertices of the regular polygon.

9. The semiconductor device of claim 1, wherein the one of the plurality of the repeated units satisfies the following equation:

$$60\% \leq [(a1+a2)/A] \times 100\% \leq 85\%.$$

10. The semiconductor device of claim 1, wherein the surface area which is devoid of any first pattern and any second pattern comprises sapphire c-plane.

11. The semiconductor device of claim 1, wherein each of the first patterns further comprises a first height and each of the second patterns further comprises a second height smaller than the first height.

* * * * *